(12) United States Patent
Chu et al.

(10) Patent No.: US 9,202,554 B2
(45) Date of Patent: Dec. 1, 2015

(54) METHODS AND CIRCUITS FOR GENERATING PHYSICALLY UNCLONABLE FUNCTION

(71) Applicant: International Business Machines Corporation, Armonk, NY (US)

(72) Inventors: Albert M. Chu, Nashua, NH (US); Nazmul Habib, Colchester, VT (US); Daryl M. Seitzer, South Burlington, VT (US); Rohit Shetty, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/208,740

(22) Filed: Mar. 13, 2014

(65) Prior Publication Data

US 2015/0262653 A1  Sep. 17, 2015

(51) Int. Cl.
*G11C 11/00* (2006.01)
*G11C 11/417* (2006.01)

(52) U.S. Cl.
CPC .................................... *G11C 11/417* (2013.01)

(58) Field of Classification Search
CPC ...... G11C 11/41; G11C 11/413; G11C 16/22; G11C 2029/0403; G11C 2029/5002; G11C 29/08; G11C 29/50; G11C 5/005; G11C 7/06
USPC .......... 365/154, 189.07, 189.05, 189.11, 201, 365/230.06, 230.08
See application file for complete search history.

(56) References Cited

U.S. PATENT DOCUMENTS

| 3,662,351 A | 5/1972 | Ho et al. |
| 3,755,793 A | 8/1973 | Ho et al. |
| 3,764,825 A | 10/1973 | Stewart |
| 3,798,621 A | 3/1974 | Baitinger et al. |
| 3,801,967 A | 4/1974 | Berger et al. |
| 4,198,696 A | 4/1980 | Bertin et al. |

(Continued)

FOREIGN PATENT DOCUMENTS

| EP | 0156135 A | 10/1985 |
| JP | 58108095 A | 6/1983 |

OTHER PUBLICATIONS

Selimis et al., "Evaluation of 90nm 6T-SRAM as Physical Unclonable Function for Secure Key Generation in Wireless Sensor Nodes", IEEE 2011.

(Continued)

*Primary Examiner* — Thong Q Le
(74) *Attorney, Agent, or Firm* — Steven J. Meyers; Hoffman Warnick LLC

(57) ABSTRACT

Various embodiments include solutions for generating a physically unclonable function. In some cases, a method includes an electronic circuit including: a static random access memory (SRAM) device having at least one memory cell with at least one transistor device therein, SRAM bias temperature instability aging circuitry coupled with the SRAM device and configured to apply aging conditions to the at least one memory cell to degrade the at least one transistor device within the at least one memory cell, and at least one computing device coupled with the SRAM device and configured to: skew a storage cell value in the at least one transistor device, measure a skewed value of the storage cell after the skewing, and create a physically unclonable function from the skewed value of the storage cell.

16 Claims, 7 Drawing Sheets

(56) References Cited

U.S. PATENT DOCUMENTS

| | | |
|---|---|---|
| 4,418,401 A | 11/1983 | Bansal |
| 5,148,390 A | 9/1992 | Hsieh |
| 6,826,094 B1 | 11/2004 | Perner et al. |
| 7,002,371 B2 | 2/2006 | Kase et al. |
| 7,333,379 B2 | 2/2008 | Ramadurai et al. |
| 7,681,103 B2 | 3/2010 | Devadas et al. |
| 8,035,426 B1 | 10/2011 | Ecker et al. |
| 8,130,955 B2 | 3/2012 | Trichina et al. |
| 8,159,260 B1 | 4/2012 | Behrends et al. |
| 8,339,875 B2 | 12/2012 | Tuyls et al. |
| 8,495,431 B2 | 7/2013 | Gebara et al. |
| 8,516,269 B1 | 8/2013 | Hamlet et al. |
| 8,525,169 B1 | 9/2013 | Edelstein et al. |
| 8,694,856 B2 * | 4/2014 | Tuyls et al. ............ 714/763 |
| 2009/0271860 A1 | 10/2009 | Nonaka et al. |
| 2011/0317829 A1 | 12/2011 | Ficke et al. |
| 2012/0020145 A1 | 1/2012 | Huber et al. |
| 2012/0066571 A1 | 3/2012 | Marinet |
| 2012/0072476 A1 | 3/2012 | Bucci et al. |
| 2012/0230087 A1 | 9/2012 | Chellappa et al. |
| 2013/0194886 A1 | 8/2013 | Schrijen et al. |
| 2013/0222013 A1 | 8/2013 | Feng et al. |

OTHER PUBLICATIONS

Vivekraja et al., "Feedback Based Supply Voltage Control for Temperature Variation Tolerant PUFs", 2011 24th Annual Conference on VLSI Design, pp. 214-219.

"Physically Unclonable Function Enhancement to Guarantee Repeatable Behavior", ip.com Prior Art Database, Technical Disclosure, Aug. 31, 2010, 5 pages.

* cited by examiner

METHODS AND CIRCUITS FOR GENERATING PHYSICALLY UNCLONABLE FUNCTION

TECHNICAL FIELD

Aspects of the invention relate generally to static random access memory (SRAM) devices. More particularly, various aspects of the invention relate to generating a physically unclonable function using bias temperature instability aging.

BACKGROUND

Certain sensitive commercial and industrial storage applications require secure hardware based identifiers (ID). Secure identifiers ensure the safe and reliable transfer of data. In order to remain secure, the IDs typically must be randomly created, non-volatile, and unobservable when subjected to factor analysis.

Conventionally, field programmable gate array programming is used to create a secure ID for coding encryption. SRAM bit storage cells initialize in a particular position based on the process variation. Unfortunately, not all of the bit storage cells initialize as predicted, creating difficulties in verification. Variations in initializing position can be caused by numerous external factors including environmental conditions. Furthermore, usage of non-volatile memory to store bit addresses adds overhead area and integration complexity. Lastly, conventional systems include an interface that may be leveraged in a reverse engineering attempt.

BRIEF SUMMARY

Solutions for generating a physically unclonable function are disclosed herein. In some cases, an electronic circuit includes: a static random access memory (SRAM) device having at least one memory cell with at least one transistor device therein, SRAM bias temperature instability aging circuitry coupled with the SRAM device and configured to apply aging conditions to the at least one memory cell to degrade the least one transistor device within the at least one memory cell, and storage cell skew measurement circuitry coupled with the SRAM device and configured to: skew a storage cell value in the at least one transistor device, measure a skewed value of the storage cell after the skewing, and create a physically unclonable function from the skewed value of the storage cell.

A first aspect includes an electronic circuit including: a static random access memory (SRAM) device having at least one memory cell with at least one transistor device therein, SRAM bias temperature instability aging circuitry coupled with the SRAM device and configured to apply aging conditions to the at least one memory cell to degrade the least one transistor device within the at least one memory cell, and storage cell skew measurement circuitry coupled with the SRAM device and configured to: skew a storage cell value in the at least one transistor device, measure a skewed value of the storage cell after the skewing, and create a physically unclonable function from the skewed value of the storage cell.

A second aspect includes a method including: initiating a power sequence in a SRAM device having at least one memory cell, wherein bias temperature instability (BTI) aging conditions degrade at least one transistor in the at least one memory cell, skewing a storage cell value of the least one transistor using a programmable digital power source, and generating a physically unclonable function using the skewed value of the storage cell of the at least one transistor in the at least one memory cell.

A third aspect includes a method including: initiating a power sequence in a static random access memory (SRAM) device having at least one memory cell with at least one transistor device therein, wherein bias temperature instability (BTI) aging conditions degrade the at least one transistor in the at least one memory cell, measuring an initial storage cell value of a storage cell in the at least one transistor in the SRAM device, skewing the storage cell value of the least one transistor in the at least one memory cell with a programmable digital power source, measuring the skew of the storage cell value after the skewing of the at least one transistor in the at least one memory cell relative to the initial storage cell value, recovering the initial storage cell value of the storage cell in response to measuring the skew of the storage cell and in response to the measured skew of the storage cell value not returning to the initial storage cell value, and generating a physically unclonable function using the initial storage cell value of the at least one transistor in the at least one memory cell.

BRIEF DESCRIPTION OF THE DRAWINGS

It is noted that the drawings are not necessarily to scale. The drawings are intended to depict only typical aspects, and therefore should not be considered as limiting in scope. In the drawings, like numbering represents like elements between the drawings.

DETAILED DESCRIPTION

In the following description, reference is made to the accompanying drawings that form a part thereof, and in which is shown by way of illustration specific example embodiments in which the present teachings may be practiced. These embodiments are described in sufficient detail to enable those skilled in the art to practice the present teachings and it is to be understood that other embodiments may be utilized and that changes may be made without departing from the scope of the present teachings. The following description is, therefore, merely illustrative.

In order to describe aspects of the various embodiments conveniently, the following technical terms are defined: $V_{dd}$: drain-voltage and $I_d$: drain current. In addition, it is understood that all references herein to drain-voltage and drain-current are taken at a drain contact of a metal-oxide-semiconductor field-effect transistor (MOSFET).

Various particular embodiments relate to SRAM circuitry and accessing memory cells therein. Particular embodiments include circuitry and methods for generating a physically unclonable function for an SRAM device. Specifically, embodiments include reinforcing the initialization state of bit storage cells within an SRAM device using Bias Temperature Instability (BTI) aging.

Figure 1:
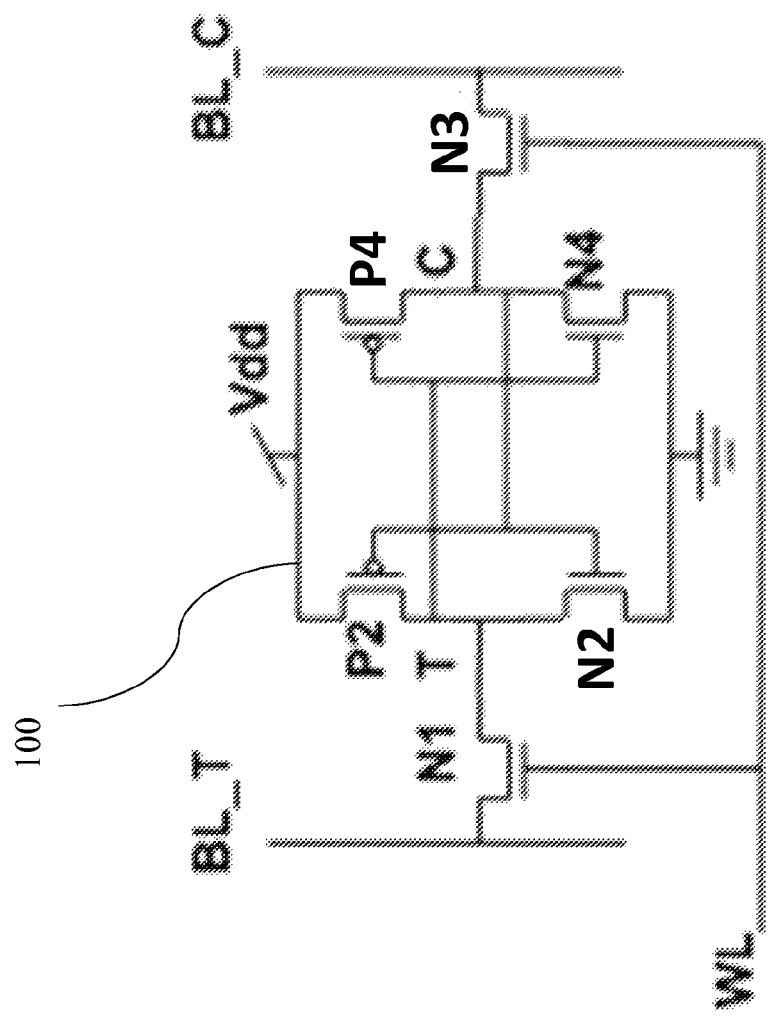
FIG. 1 shows a schematic diagram illustrating SRAM circuitry.

Turning to FIG. 1, static random access memory circuitry, as referred to herein, is shown. According to various embodiments, SRAM device 100 includes a six-transistor SRAM cell having six metal-oxide-semiconductor field-effect transistors (MOSFETs). As is understood, a MOSFET transistor can include NFET and PFET transistors. According to additional embodiments, SRAM device 100 can include four, eight, or ten transistors. As further understood, bit storage cells within each transistor have two stable states, denoted by either a 1 or a 0. Referring to FIG. 1, bits within SRAM device 100 are stored on transistors P2, P4, N2, and N4. Transistors N1 and N3, collectively referred to as access transistors, enable SRAM device 100 to connect to bit lines BL_T and BL_C. In various embodiments, N1, N2, N3, and N4 include an NFET transistor and P2 and P4 include a PFET transistor.

Access transistors N1 and N3 are controlled through word line WL. According to various embodiments, SRAM device 100 may include any number of word lines (WL0 . . . WLN). Bit lines BL_T and BL_C enable the transfer of data to transistors P2, P4, N2, and N4 during read and write operations.

During a read access, bit lines BL_T and BL_C are driven by inverters in SRAM device 100. The cycle is initiated by pre-charging bit lines BL_T and BL_C and engaging word line WL to activate transistors N1 and N3. In response to the activation of N1 and N3, values stored in the T and C nodes (shown in FIG. 1) are transferred to bit lines BL_T and BL_C. For example, BL_T can be left at its pre-charged value and BL_C can be discharged through N1 and N2. This pulls BL_C towards the drain voltage of the circuit. A sense amplifier, or equivalent thereof, will sense the difference in the lines and determine the value that was initially stored in the bit storage cell.

During a write operation, a predetermined value is applied to bit lines BL_T and BL_C. For example, if a 0 is desired, BL_T is set to 0 and BL_C is set to 1. Conversely, if a 1 is desired, BL_T is set to 1, and BL_C is set to 0. The predetermined value is written by inversing the bit lines. The access transistors (e.g., N1 and N3) are activated, and the value is latched in the memory cell.

Figure 2:
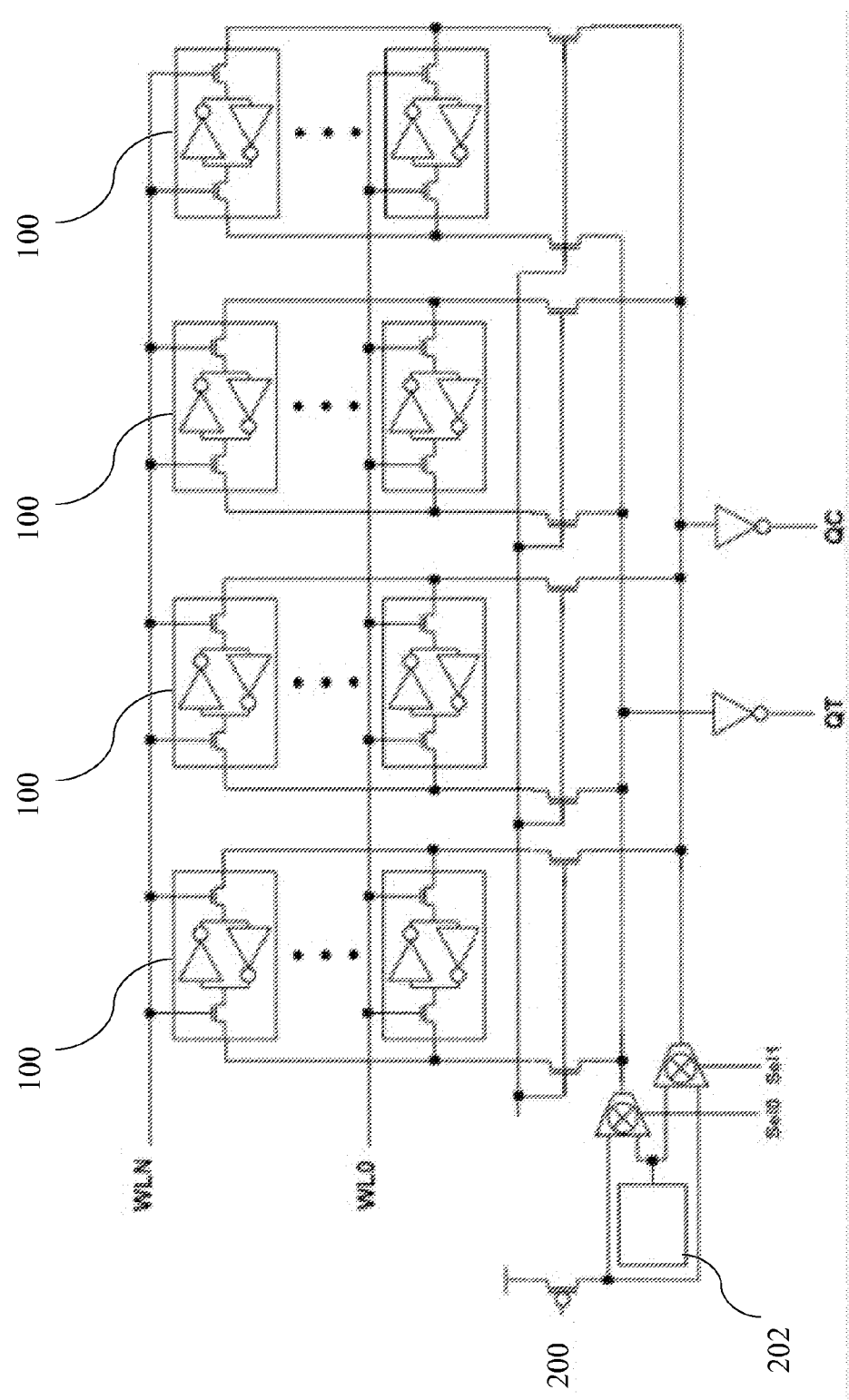
FIG. 2 shows a schematic diagram of SRAM devices according to various embodiments.

Turning to FIG. 2, with continuing reference to FIG. 1, a schematic of multiple SRAM devices (e.g., SRAM device 100) according to various embodiments is shown. The group of SRAM devices includes a plurality of shared word lines WL0 . . . WLN. Each SRAM device 100 is coupled to a programmable digital power supply 202 and a drain voltage power supply 200 ($V_{dd}$ power supply). As shown in FIG. 2, various embodiments include SRAM devices (e.g., SRAM device 100) arranged in rows or columns. For example, an embodiment can include 64 to 1024 rows per block. The maximum number of rows is typically limited by the bit storage cell on/off current ratio and is process dependent. FIG. 2 is exemplary of various embodiments, and is not intended to be limiting.

Various embodiments as disclosed herein include an electronic circuit having SRAM Bias Temperature Instability (BTI) aging circuitry coupled with the SRAM device and configured to apply aging conditions to the at least one memory cell to degrade at least one transistor device within the at least one memory cell. Unintentional BTI aging generally manifests as an increase in threshold voltage, decrease in drain current, and consequent decrease in transconductance of a MOSFET device. It is understood that interfacial layers composed of nitride silicon dioxide as a result of the spontaneous oxidation of the silicon substrate in the MOSFET when high-K dielectrics are deposited are responsible for aging conditions.

According to various embodiments, intentional BTI aging conditions are applied through voltage and temperature acceleration. For example, these conditions can be applied with a burn-in oven tool and can be created in PFET or NFET MOSFETS. For example, referring to FIG. 1, assuming node T powers up to a logic 1, and node C powers up to a logic 0, during the BTI stress, transistors N2, P4, and N3 will degrade. As a result of the stress, N2, P4, and N3 will be "weaker" (i.e., higher threshold voltage and lower drain current). The stress culminates as an increase in impedance of transistors N2, P4, and N3, thereby causing an imbalance in the storage cell. As described herein, the stress caused by BTI aging conditions reinforce the initialization state of the bit storage cell in SRAM device 100.

The power-up state of SRAM device 100 is defined by the differential voltage:

V(T)−V(C).

Where V(T) and V(C) are defined by N1, N2, and N3, N4. As such, $$V(T) = V(\text{BL\_T}) * \frac{z_{N2}}{z_{N1} + z_{N2}}$$

and $$V(C) = V(\text{BL\_C}) * \frac{z_{N4}}{z_{N3} + z_{N4}}.$$

V(C) is greater before the stress than after the stress, and V(T) is greater after the stress than before the stress.

Further embodiments include at least one computing device coupled with the SRAM device and configured to skew a storage cell value in the at least one transistor device, measure a skewed value of the storage cell after the skewing, and create a physically unclonable function from the skewed value of the storage cell. By controlling the bias voltage on selected devices in the SRAM bit storage cell, certain devices are degraded while others are not. This imbalance results in a skew in the bit storage cell. Bit lines BL_T and BL_C are skewed to ensure that consistent bit values are returned from SRAM device 100. Voltage levels are incrementally varied to simulate external influences on the SRAM cell. The range of voltages is measured during the skewing process to determine how far the bit storage cell is skewed.

Figure 3:
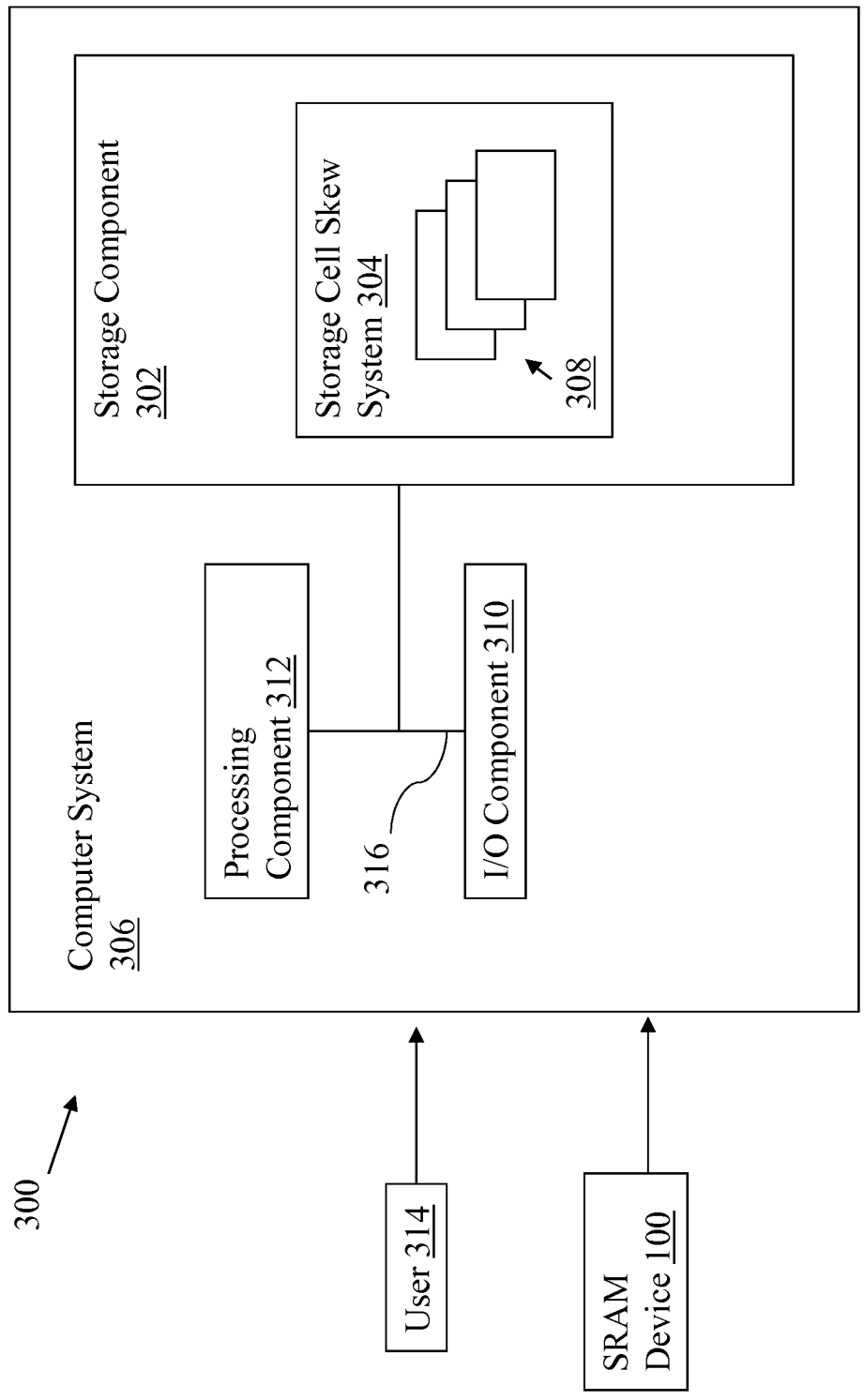
FIG. 3 shows a schematic environment for generating a physically unclonable function according to various embodiments.

FIG. 3 depicts an illustrative environment 300 for generating a physically unclonable function according to embodiments. To this extent, the environment 300 includes a computer system 306 that can perform a process described herein to skew a storage cell. In particular, the computer system 306 is shown as including a storage cell skew system 304, which makes computer system 306 operable to skew a storage cell value in the at least one transistor device, measure a skewed value of the storage cell after the skewing, and create a physically unclonable function from the skewed value of the storage cell.

The computer system 306 is shown including a processing component 312 (e.g., one or more processors), a storage component 302 (e.g., a storage hierarchy), an input/output (I/O) component 310 (e.g., one or more I/O interfaces and/or devices), and a communications pathway 316. In general, the processing component 312 executes program code, such as storage cell skew system 304, which is at least partially fixed in the storage component 302. While executing program code, the processing component 312 can process data, which can result in reading and/or writing transformed data from/to the storage component 302 and/or the I/O component 310 for further processing. The pathway 316 provides a communications link between each of the components in the computer system 306. The I/O component 310 can comprise one or more human I/O devices, which enable a user (e.g., a human or other user) 314 and SRAM device 100 to interact with the computer system 306 and/or one or more communications devices to enable a system user 314 to communicate with the computer system 306 using any type of communications link. To this extent, storage cell skew system 304 can manage a set of interfaces (e.g., graphical user interface(s), application program interface, etc.) that enable human and/or system users 314 to interact with storage cell skew system 304, and allow SRAM device 100 to communicate voltage and/or current data of SRAM device 100, or storage cell value data to storage cell skew system 304. Further, storage cell skew system 304 can manage (e.g., store, retrieve, create, manipulate, organize, present, etc.) data, voltage and/or current data of SRAM device 100, or storage cell value data. According to further embodiments, voltage and/or current data of SRAM device 100, or storage cell value data, as used herein is obtained from a voltage sensor, a current sensor, an electronic test instrument (e.g., oscilloscope or oscillograph), and/or logic outside SRAM device 100.

In any event, the computer system 306 can comprise one or more general purpose computing articles of manufacture (e.g., computing devices) capable of executing program code, such as the storage cell skew system 304, installed thereon. As used herein, it is understood that "program code" means any collection of instructions, in any language, code or notation, that cause a computing device having an information processing capability to perform a particular function either directly or after any combination of the following: (a) conversion to another language, code or notation; (b) reproduction in a different material form; and/or (c) decompression. To this extent, the storage cell skew system 304 can be embodied as any combination of system software and/or application software.

Further, storage cell skew system 304 can be implemented using a set of modules 308. In this case, a module 308 can enable the computer system 306 to perform a set of tasks used storage cell skew system 304, and can be separately developed and/or implemented apart from other portions of storage cell skew system 304. As used herein, the term "component" means any configuration of hardware, with or without software, which implements the functionality described in conjunction therewith using any solution, while the term "module" means program code that enables the computer system 306 to implement the functionality described in conjunction therewith using any solution. When fixed in a storage component 302 of a computer system 306 that includes a processing component 312, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of the computer system 306.

When the computer system 306 comprises multiple computing devices, each computing device may have only a portion of storage cell skew system 304 (e.g., one or more modules 308). However, it is understood that the computer system 306 and storage cell skew system 304 are only representative of various possible equivalent computer systems that may perform a process described herein. To this extent, in other embodiments, the functionality provided by the computer system 306 and storage cell skew system 304 can be at least partially implemented by one or more computing devices that include any combination of general and/or specific purpose hardware with or without program code. In each embodiment, the hardware and program code, if included, can be created using standard engineering and programming techniques, respectively.

Regardless, when the computer system 306 includes multiple computing devices, the computing devices can communicate over any type of communications link. Further, while performing a process described herein, the computer system 306 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

The computer system 306 can obtain or provide data, voltage and/or current data of SRAM device 100, or storage cell value data using any solution. For example, the computer system 306 can generate and/or be used to voltage and/or current data of SRAM device 100, or storage cell value data to another system, etc.

According to various embodiments, the storage cell value in the at least one transistor device is skewed by initializing the bit storage cell equal to 0. Bit storage cell $V_{dd}$ power supply 200 is deactivated, programmable digital power source 202 is set to equalize bit lines BL_T and BL_C of SRAM device 100 at the $V_{dd}$ value, word line WL in SRAM device 100 is activated in response to the equalized bit lines BL_T and BL_C, bit storage cell $V_{dd}$ power supply 200 is activated, and word line WL is deactivated. Once programmable digital power supply 202 is disabled, an initial read is performed on SRAM device 100. The read determines whether the value stored in the bit storage cell in SRAM device 100 is a 1 or a 0.

Assuming a 0 is recovered by the read, drain voltage power supply 200 is deactivated, programmable digital power supply 202 is incremented to lower the voltage in bit line BL_C in SRAM device 100, word line WL is activated, bit storage cell $V_{dd}$ power supply 200 is activated, word line WL is deactivated, programmable digital power supply 202 is deactivated, and a second read is performed on SRAM device 100. As described herein, the programmable digital power supply 202 is incremented until a predetermined maximum is met. The predetermined maximum value is determined to be consistent with the expected bit storage cell skew voltage. For example, this can be ten percent of the supply voltage (e.g., 100 mV).

If the storage cell value returned during the read is not the initial value read, (for example a 1 was read initially, and a 0 was returned after skewing SRAM device 100) the voltage value of programmable digital power supply 202 is measured against a predetermined threshold. According to various embodiments, the predetermined threshold represents a range in which the bit storage cell will accurately initialize in a predictable condition in response to external conditions. If the value of programmable digital power supply 202 falls within this threshold, SRAM device 100 is determined to be unreliable. In various embodiments, the at least one computing device coupled with SRAM device 100 is further adapted to store the voltage value of programmable digital power supply 202 in a register for access during skewing, reading, and writing.

Similarly, assuming a 1 is recovered by the initial read, bit storage cell $V_{dd}$ power supply 200 is deactivated, programmable digital power supply 202 is incremented to lower the voltage in bit line T BL_T, word line WL is activated, bit storage cell $V_{dd}$ power supply 200 is activated, word line WL is deactivated, programmable digital power supply 202 is deactivated, and a second read is performed on SRAM device 202. As described herein, the programmable digital power supply 202 is incremented until a predetermined maximum is met. If the storage cell value returned during the read is not the initial value read, the voltage value of programmable digital power supply 202 is measured against the predetermined threshold.

According to various embodiments, the least one computing device coupled with SRAM device 100 is further configured to repeat the skewing procedure, as described herein, for each bit storage cell in SRAM device 100. In various embodiments, the at least one computing device is configured to skew each storage cell in SRAM device 100 until the accompanying digital programmable power supply 202 value for each storage cell exceeds the predetermined threshold. At this point, assuming no storage cells have been found unreliable, and each accompanying value exceeds the corresponding threshold, a physically unclonable function is generated.

Figure 4:
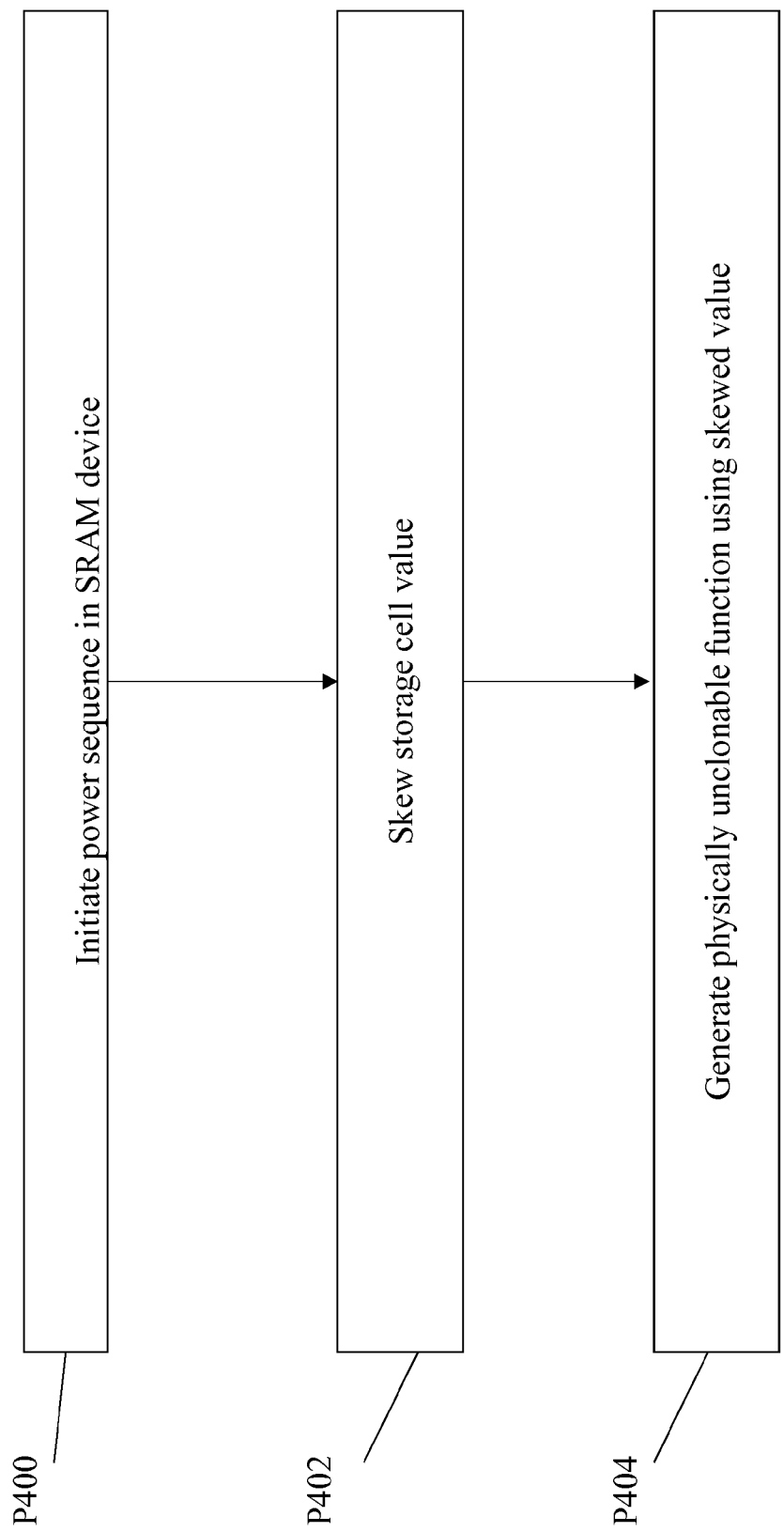
FIGS. 4, 5, and 6A-B show flow diagrams depicting a process according to various embodiments.

Turning now to FIG. 4, a flow diagram depicting a method of generating a physically unclonable function can include the following processes:

P400: Initiating a power sequence in a static random access memory (SRAM) device having at least one memory cell, wherein bias temperature instability (BTI) aging conditions degrade at least one transistor in the at least one memory cell. As disclosed herein, BTI aging conditions can be induced by voltage and temperature acceleration. For example, BTI aging may be performed with a burn-in oven tool.

P402: After initiating a power sequence in a static random access memory (SRAM) device having at least one memory cell, wherein bias temperature instability (BTI) aging conditions degrade at least one transistor in the at least one memory cell, the method can include skewing a storage cell value of the least one transistor using programmable digital power source 202. According to various embodiments, programmable digital power source 202 includes a digital-to-analog converter.

According to various embodiments, a bit address in SRAM device 100 is initialized to a 0. Bit storage cell $V_{dd}$ supply 202 is deactivated, programmable digital power source 202 is set to equalize bit lines BL_T and BL_C of SRAM device 100 at the $V_{dd}$ value, word line WL in SRAM device 100 is activated in response to the equalized bit lines BL_T and BL_C, bit storage cell $V_{dd}$ power supply 200 is activated, and word line WL is deactivated. Once programmable digital power supply 202 is disabled, an initial read is performed on SRAM device 100.

As further disclosed herein, assuming a 0 is recovered by the read, drain voltage power supply 200 is deactivated, programmable digital power supply 202 is incremented to lower the voltage in bit line C BL_C in SRAM device 100, word line WL is activated, bit storage cell $V_{dd}$ power supply 200 is activated, word line WL is deactivated, programmable digital power supply 202 is deactivated, and a second read is performed on SRAM device 100. Programmable digital power supply 200 is incremented until a predetermined maximum is met. If the storage cell value returned during the read is not the initial value read, the voltage value of programmable digital power supply 202 is measured against the predetermined threshold. If the value of programmable digital power supply 202 falls within this threshold, SRAM device 100 is determined to be unreliable, and a physically unclonable function cannot be generated. In various embodiments, the at least one computing device coupled with SRAM device 100 is further configured to store the voltage value of programmable digital power supply 202 in a register for access during skewing, reading, and writing.

As further disclosed herein, if a 1 is initially read, bit storage cell $V_{dd}$ power supply 200 is deactivated, programmable digital power supply 202 is incremented to lower the voltage in bit line BL_T, word line WL is activated, bit storage cell $V_{dd}$ power supply 200 is activated, word line WL is deactivated, programmable digital power supply 202 is deactivated, and a second read is performed on SRAM device 202. Programmable digital power supply 202 is incremented until a predetermined maximum is met. If the storage cell value returned during the read is not the initial value read, the voltage value of programmable digital power supply 202 is measured against a predetermined threshold.

According to various embodiments, the skewing process, as described herein, can be repeated for each storage cell in SRAM device 100. In various embodiments, each storage cell in SRAM device 100 is skewed until the accompanying digital programmable power supply 202 value for each bit storage cell exceeds the predetermined threshold. This process is repeated for each accompanying bit address.

P404: After skewing a storage cell value of the least one transistor using a programmable digital power source, the method can include generating a physically unclonable function using the skewed value of the storage cell of the at least one transistor in the at least one memory cell. In various embodiments, each storage cell is skewed and each accompanying programmable digital power supply 202 value is measured against the corresponding predetermined threshold. If each accompanying value exceeds the corresponding threshold, and SRAM device 100 consistently initializes in the same value, a physically unclonable function is generated.

Figure 5:
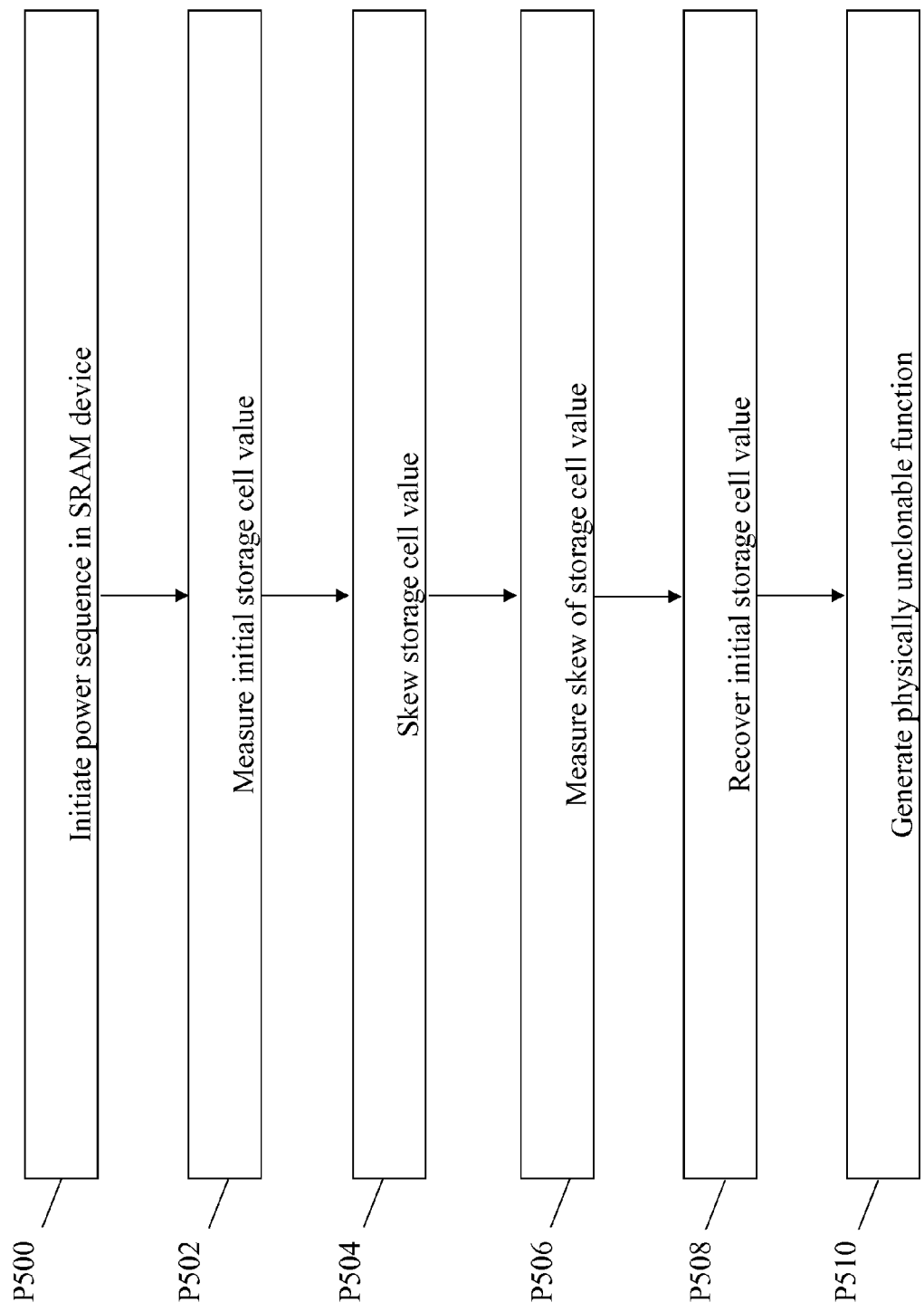

Turning now to FIG. 5, a method for recovering a skewed value in a storage cell according to various embodiments disclosed herein can include:

P500: Initiating a power sequence in a static random access memory (SRAM) device having at least one memory cell with at least one transistor device therein, wherein bias temperature instability (BTI) aging conditions degrade the at least one transistor in the at least one memory cell. As disclosed herein, BTI aging conditions can be induced through voltage and temperature acceleration. For example, BTI aging may be performed with a burn-in oven tool.

P502: After initiating a power sequence in a static random access memory (SRAM) device having at least one memory cell with at least one transistor device therein, wherein bias temperature instability (BTI) aging conditions degrade the at least one transistor in the at least one memory cell, the method can include measuring an initial storage cell value of a storage cell in the at least one transistor in the SRAM device. According to various embodiments, a bit storage address in SRAM device 100 is initialized to a 0. Bit storage cell $V_{dd}$ power supply 200 is deactivated, programmable digital power source 202 is set to equalize bit lines BL_T and BL_C of SRAM device 100 at the $V_{dd}$ value, word line WL in SRAM device 100 is activated in response to the equalized bit lines BL_T and BL_C, bit storage cell $V_{dd}$ power supply 200 is activated, and word line WL is deactivated. Once programmable digital power supply 202 is disabled, the initial read is performed on SRAM device 100. The read determines whether the value stored in the memory cell is a 1 or a 0.

P504: After measuring an initial storage cell value of a storage cell in the at least one transistor in the SRAM device, the method can include skewing the storage cell value of the least one transistor in the at least one memory cell with a programmable digital power source. As disclosed herein, assuming a 0 is recovered by the initial read, drain voltage power supply 200 is deactivated, programmable digital power supply 202 is incremented to lower the voltage in bit line C BL_C in SRAM device 100, word line WL is activated, bit storage cell $V_{dd}$ power supply 200 is activated, word line WL is deactivated, programmable digital power supply 202 is deactivated, and a second read is performed on SRAM device 100. As described herein, programmable digital power supply 202 is incremented until a predetermined maximum is met. In various embodiments, the at least one computing device coupled with SRAM device 100 is further configured to store the voltage value of programmable digital power supply 202 in a register for access during skewing, reading, and writing.

As further disclosed herein, assuming a 1 is recovered by the initial read, bit storage cell $V_{dd}$ power supply 200 is deactivated, programmable digital power supply 202 is incremented to lower the voltage in bit line T BL_T, word line WL is activated, bit storage cell $V_{dd}$ power supply 200 is activated, word line WL is deactivated, programmable digital power supply 202 is deactivated, and a second read is performed on SRAM device 202. Programmable digital power supply 202 is incremented until a predetermined maximum is met.

P506: After skewing the storage cell value of the least one transistor in the at least one memory cell with a programmable digital power source, the method can include measuring the skew of the storage cell value after the skewing of the at least one transistor in the at least one memory cell relative to the initial storage cell value. If the storage cell value returned during the read is not the initial value read, (for example a 1 was read initially, and a 0 was returned after skewing SRAM device 100) the voltage value of programmable digital power supply 202 is measured against a predetermined threshold. If the value of programmable digital power supply 202 falls within this threshold, SRAM device 100 is determined to be unreliable, and a recovery must be performed.

P508: After measuring the skew of the storage cell value after the skewing of the at least one transistor in the at least one memory cell relative to the initial storage cell value, the method can include recovering the initial storage cell value of the storage cell in response to measuring the skew of the storage cell and in response to the measured skew of the storage cell value not returning to the initial storage cell value.

P510: After recovering the initial storage cell value of the storage cell in response to measuring the skew of the storage cell and in response to the measured skew of the storage cell value not returning to the initial storage cell value, the method can include generating a physically unclonable function using the initial storage cell value of the at least one transistor in the at least one memory cell. In various embodiments, each storage cell is skewed and each accompanying programmable digital power supply 202 value is measured against the corresponding predetermined threshold. If each accompanying value does not exceed the predetermined threshold, additional embodiments include using memory repair to remove the least skewed storage cells. According to various embodiments, SRAM device 100 can include extra (redundant) rows or columns of bit storage cells. These redundant rows or columns can be swapped electrically to replace the undesirable bit storage cells in a memory repair process.

Further embodiments include error-correcting code to recover any bits that are not sufficiently skewed to initialize in the same state. As used herein, error-correcting code can include adding additional bit storage cells. The additional bits can be used to detect single-bit errors and reconstruct insufficiently skewing bits. In various embodiments, error-correcting code can reconstruct a single insufficiently skewing bit.

Figure 6A:
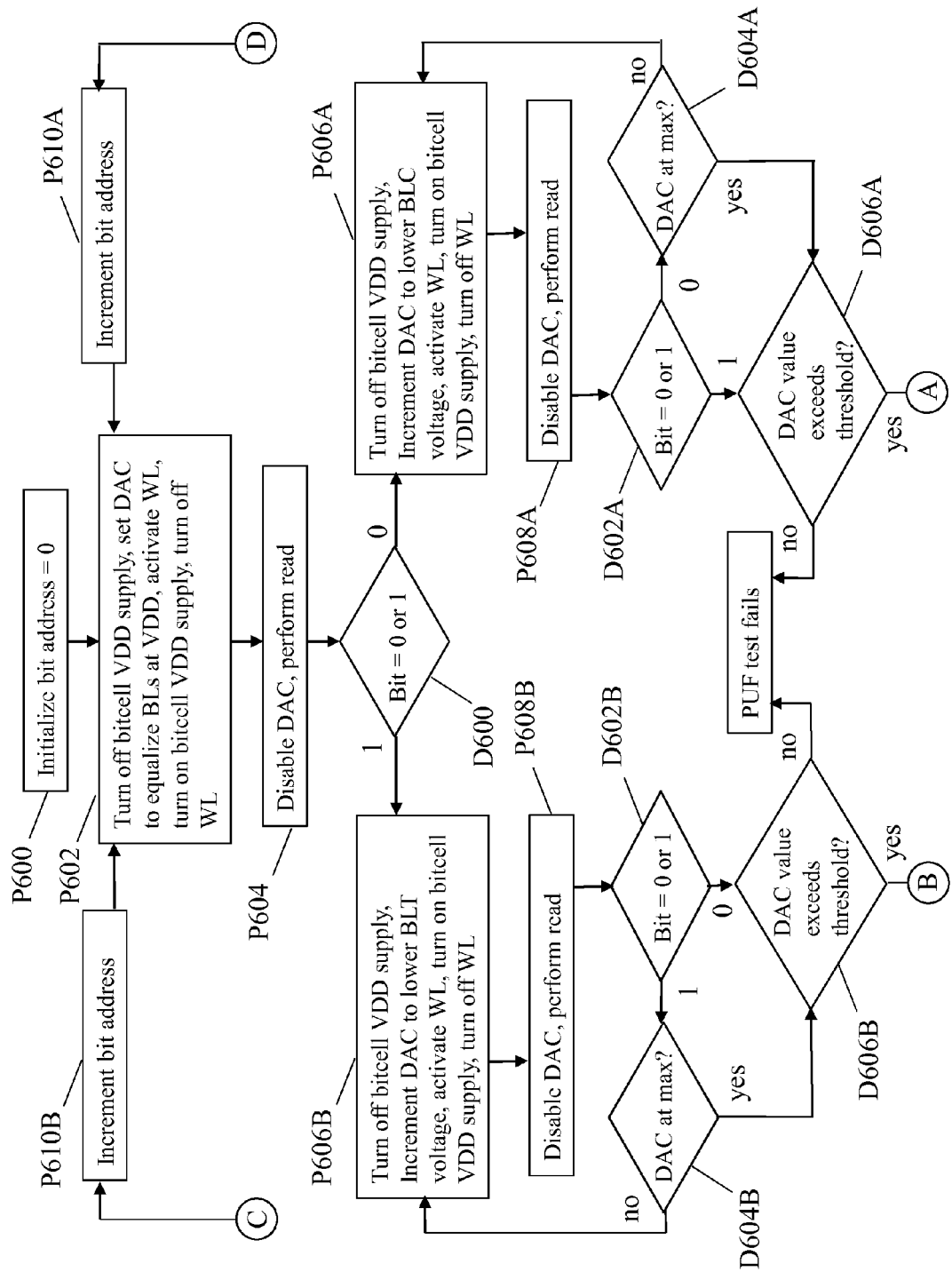
Figure 6B:
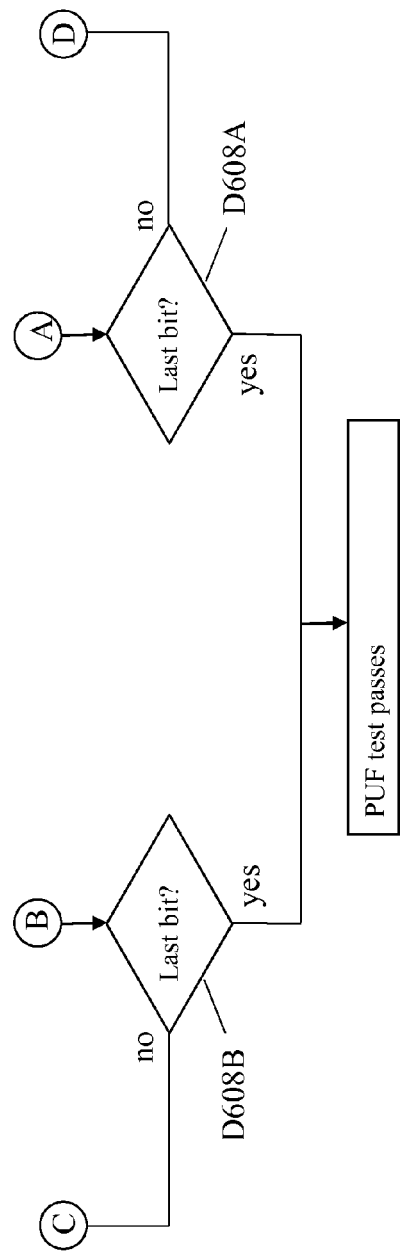

Turning now to FIG. 6A and FIG. 6B, a method for skewing a storage cell according to alternate embodiments disclosed herein can include the processes and decision shown in the flow diagram. The method can include:

P600: Initializing a bit address of SRAM device 100 equal to 0.

P602: After initializing the bit address of and SRAM device equal to 0, the method can include activating bit storage cell $V_{dd}$ power supply 200, setting programmable digital power source 202 to equalize bit lines BL_T and BL_C of SRAM device 100 at the $V_{dd}$ value, activating word line WL in SRAM device 100 in response to the equalized bit lines BL_T and BL_C, activating bit storage cell $V_{dd}$ power supply 200, and deactivating word line WL.

P604: After activating bit storage cell $V_{dd}$ power supply 200, setting programmable digital power source 202 to equalize bit lines BL_T and BL_C of SRAM device 100 at the $V_{dd}$ value, activating word line WL in SRAM device 100 in response to the equalized bit lines BL_T and BL_C, activating bit storage cell $V_{dd}$ power supply 200, and deactivating word line WL, the method can include disabling programmable digital power supply 202 and performing a first read.

D600: In response to disabling programmable digital power supply 202 and performing a first read, the method can include determining whether the value stored in the memory cell is a 1 or a 0.

P606A: Assuming a 0 is determined, the method can include deactivating drain voltage power supply 200, incrementing programmable digital power supply 202 to lower the voltage in bit line BL_C in SRAM device 100, activating word line WL, activating bit storage cell $V_{dd}$ power supply 200, and deactivating word line WL in response to determining a 0.

P608A: After deactivating drain voltage power supply 200, incrementing programmable digital power supply 202 incremented to lower the voltage in bit line BL_C in SRAM device 100, activating word line WL, activating bit storage cell $V_{dd}$ power supply 200, and deactivating word line WL, the method can include disabling programmable digital power supply 202 and performing a second read.

D602A: In response to disabling programmable digital power supply 202 and performing a read, the method can include determining whether the value stored in the memory cell is a 1 or a 0.

D604A: Assuming a 0 is read, the method can include determining whether programmable digital power supply 202 has met a predetermined maximum as described herein. If the predetermined maximum has not been reached, the method can include returning to process P606A and repeating the process as described therein.

D606A: Assuming programmable digital power supply 202 has met the predetermined maximum, or the value stored in the memory cell determined from D602A is a 1, the method as described herein can include determining whether programmable digital power supply 202 exceeds a predetermined threshold as described herein. If the predetermined threshold has not been exceeded, SRAM device is not reliable and a physically unclonable function has not been created.

D608A: Assuming the predetermined threshold has been exceeded, the method can include determining whether the bit address measured is the last bit address on SRAM device 100.

P610A: Assuming the bit address measured is not the last bit address on SRAM device 100, the process can include incrementing the bit address and returning to process P602, as shown in FIG. 6A.

With continuing reference to FIG. 6A and FIG. 6B, in the instance that a 1 instead of a 0 is read during determination D600, the process as described herein can include:

P606B: Deactivating drain voltage power supply 200, incrementing programmable digital power supply 202 to lower the voltage in bit line BL_T in SRAM device 100, activating word line WL, activating bit storage cell $V_{dd}$ power supply 200, and deactivating word line WL in response to determining a 1.

P608B: After deactivating drain voltage power supply 200, incrementing programmable digital power supply 202 to lower the voltage in bit line BL_T in SRAM device 100, activating word line WL, activating bit storage cell $V_{dd}$ power supply 200, and deactivating word line WL, the method can include disabling programmable digital power supply 202 and performing a second read.

D602B: In response to disabling programmable digital power supply 202 and performing a read, the method can include determining whether the value stored in the memory cell is a 1 or a 0.

D604B: Assuming a 1 is read, the method can include determining whether programmable digital power supply 202 has met a predetermined maximum as described herein. If the predetermined maximum has not been reached, the method can include returning to P606B and repeating the process as described therein.

D606B: Assuming programmable digital power supply 202 has met the predetermined maximum, or the value stored in the memory cell determined from D602B is a 0, the method as described herein can include determining whether programmable digital power supply 202 exceeds a predetermined threshold as described herein. If the predetermined threshold has not been exceeded, SRAM device is not reliable and a physically unclonable function has not been created.

D608B: Assuming the predetermined threshold has been exceeded, the method can include determining whether the bit address measured is the last bit address on SRAM device 100.

P610B: Assuming the bit address measured is not the last bit address on SRAM device 100, the process can include incrementing the bit address and returning to process P602, as shown in FIG. 6A.

It is understood that in the flow diagrams shown and described herein, other processes may be performed while not being shown, and the order of processes can be rearranged according to various embodiments. Additionally, intermediate processes may be performed between one or more described processes. The flow of processes shown and described herein is not to be construed as limiting of the various embodiments.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. An electronic circuit comprising:
   a static random access memory (SRAM) device having at least one memory cell with at least one transistor device therein;
   SRAM bias temperature instability aging circuitry coupled with the SRAM device and configured to apply aging conditions to the at least one memory cell to degrade the at least one transistor device within the at least one memory cell; and
   at least one computing device coupled with the SRAM device and configured to:
      skew a storage cell value in the at least one transistor device;
      measure a skewed value of the storage cell after the skewing; and
      create a physically unclonable function from the skewed value of the storage cell;
      deactivate a drain voltage power supply applied to the at least one transistor;
      set a programmable digital power source to equalize bit lines of the SRAM device at a predetermined drain voltage value;
      activate a word line in the SRAM device in response to the equalized bit lines;
      activate the drain voltage power supply applied to the at least one transistor; and
      deactivate the word line before measuring an initial storage cell value.

2. The electronic circuit as recited in claim 1, wherein the at least one computing device is further configured to initialize a bit address of the SRAM device equal to 0.

3. The electronic circuit as recited in claim 1, wherein the programmable digital power source includes a digital-to-analog converter.

4. The electronic circuit as recited in claim 1, wherein the at least one computing device is further configured to:
   deactivate the drain voltage power supply;
   increment the programmable digital power source to lower a voltage in at least one bit line in the SRAM device;
   activate the word line,
   activate the drain voltage power supply;
   deactivate the word line; and
   deactivate the programmable digital power source before measuring the skewed value of the storage cell.

5. The electronic circuit as recited in claim 4, wherein the at least one computing device is further configured to store a value of the programmable digital power source in a register.

6. The electronic circuit as recited in claim 1, wherein the SRAM device includes a six transistor SRAM cell comprising six metal-oxide-semiconductor field-effect transistors (MOSFETs).

7. A method comprising:
   initiating a power sequence in a static random access memory (SRAM) device having at least one memory cell, wherein bias temperature instability (BTI) aging conditions degrade at least one transistor in the at least one memory cell;
   skewing a storage cell value of the least one transistor using a programmable digital power source;
   generating a physically unclonable function using the skewed value of the storage cell of the at least one transistor in the at least one memory cell;
   initializing a bit address of the SRAM device equal to 0;
   deactivating a drain voltage power supply applied to the at least one transistor;
   equalizing bit lines of the SRAM device at a predetermined voltage with a programmable digital power source;
   activating a word line in the SRAM device in response to the equalized bit lines;
   activating the drain voltage power supply applied to the at least one transistor; and deactivating the word line before measuring the initial storage cell value.

8. The method as recited in claim 7, wherein the programmable digital power source includes a digital-to-analog converter.

9. The method as recited in claim 7, further comprising:
deactivating the drain voltage power supply;
incrementing the programmable digital power source to lower a voltage in one bit line in the SRAM device;
activating the word line;
activating the drain voltage power supply;
deactivating the word line; and
deactivating the programmable digital power source before measuring the skewed value of the storage cell.

10. The method as recited in claim 9, further comprising measuring the skew of the storage cell value of the at least one transistor in the SRAM device relative to the initial storage cell value.

11. The method as recited in claim 10, further comprising storing a value of the programmable digital power source in a register.

12. The method as recited in claim 7, wherein the SRAM device includes a six transistor SRAM cell comprising six metal-oxide-semiconductor field-effect transistors (MOSFETs).

13. A method comprising:
initiating a power sequence in a static random access memory (SRAM) device having at least one memory cell with at least one transistor device therein, wherein bias temperature instability (BTI) aging conditions degrade the at least one transistor in the at least one memory cell;
measuring an initial storage cell value of a storage cell in the at least one transistor in the SRAM device;
skewing the storage cell value of the least one transistor in the at least one memory cell with a programmable digital power source;
measuring the skew of the storage cell value after the skewing of the at least one transistor in the at least one memory cell relative to the initial storage cell value;
recovering the initial storage cell value of the storage cell in response to measuring the skew of the storage cell and in response to the measured skew of the storage cell value not returning to the initial storage cell value;
generating a physically unclonable function using the initial storage cell value of the at least one transistor in the at least one memory cell; and
storing a value of the programmable digital power source in a register.

14. The method as recited in claim 13, further comprising removing a storage cell value that does not return to the initial storage cell value.

15. The method as recited in claim 13, wherein the programmable digital power source includes a digital-to-analog converter.

16. The method as recited in claim 13, wherein the SRAM device includes a six transistor SRAM cell comprising six metal-oxide-semiconductor field-effect transistors (MOSFETs).

* * * * *